United States Patent
Lee et al.

(10) Patent No.: US 7,803,654 B2
(45) Date of Patent: Sep. 28, 2010

(54) VARIABLE RESISTANCE NON-VOLATILE MEMORY CELLS AND METHODS OF FABRICATING SAME

(75) Inventors: Jin-il Lee, Sungnam (KR); Sung-lae Cho, Yongin (KR); Hye-young Park, Seongnam-si (KR); Byoung-Jae Bae, Hwaseong (KR); Young-Lim Park, Anyang (KR)

(73) Assignee: Samsung Electronics Co., Ltd. (KR)

( * ) Notice: Subject to any disclaimer, the term of this patent is extended or adjusted under 35 U.S.C. 154(b) by 384 days.

(21) Appl. No.: 11/862,779

(22) Filed: Sep. 27, 2007

(65) Prior Publication Data
US 2008/0265236 A1    Oct. 30, 2008

(30) Foreign Application Priority Data
Apr. 25, 2007    (KR) .................... 10-2007-0040501

(51) Int. Cl.
*H01L 21/00*    (2006.01)
(52) U.S. Cl. ................. 438/95; 438/384; 257/E21.068; 257/E21.071
(58) Field of Classification Search ................... 438/95, 438/382, 384, 680; 257/E21.17, E21.068, 257/E21.071
See application file for complete search history.

(56) References Cited

U.S. PATENT DOCUMENTS

| | | | |
|---|---|---|---|
| 6,953,720 B2 | 10/2005 | Moore et al. | |
| 7,112,484 B2 | 9/2006 | Gilton | |
| 2004/0026731 A1* | 2/2004 | Fournier et al. | ............. 257/314 |
| 2006/0040485 A1 | 2/2006 | Lee et al. | |
| 2006/0126424 A1* | 6/2006 | Ogiwara | ..................... 365/232 |
| 2007/0235709 A1* | 10/2007 | Kostylev et al. | ................ 257/4 |
| 2008/0017894 A1* | 1/2008 | Happ et al. | ................. 257/246 |
| 2008/0121862 A1* | 5/2008 | Liu | ............... 257/4 |

FOREIGN PATENT DOCUMENTS

KR    10-0653701 B1    11/2006
KR    10-0666876 B1    1/2007

OTHER PUBLICATIONS

Choi et al., "Cyclic PECVD of Ge2Sb2Te5 Films Using Metallorganic Sources," J. Electrochem.Soc., 154, H318-H324, (2007).*

* cited by examiner

*Primary Examiner*—Asok K Sarkar
*Assistant Examiner*—Julia Slutsker
(74) *Attorney, Agent, or Firm*—Myers Bigel Sibley & Sajovec, P.A.

(57) ABSTRACT

Methods of fabricating integrated circuit memory cells and integrated circuit memory cells are disclosed. Formation of an integrated circuit memory cell include forming a first electrode on a substrate. An insulation layer is formed on the substrate with an opening that exposes at least a portion of a first electrode. An amorphous variable resistivity material is formed on the first electrode and extends away from the first electrode along sidewalls of the opening. A crystalline variable resistivity material is formed in the opening on the amorphous variable resistivity material. A second electrode is formed on the crystalline variable resistivity material.

25 Claims, 14 Drawing Sheets

(a) H2/Ar=1/4    (b) H2/Ar=20/1

(a) H2 100 cm3/min    (b) H2 500 cm3/min    (c) H2 1000 cm3/min

VARIABLE RESISTANCE NON-VOLATILE MEMORY CELLS AND METHODS OF FABRICATING SAME

CROSS-REFERENCE TO RELATED APPLICATION

This application claims priority under 35 USC §119 to Korean Patent Application No. 10-2007-0040501, filed on Apr. 25, 2007, the disclosure of which is hereby incorporated herein by reference in its entirety as if set forth fully herein.

FIELD OF THE INVENTION

The present invention relates to non-volatile memory devices and related manufacturing methods, and more specifically to variable resistance non-volatile memory devices and related manufacturing methods.

BACKGROUND OF THE INVENTION

Non-volatile memory devices are widely used in many consumer, commercial and other applications. While some non-volatile memory devices, such as flash memory, use accumulated charge to store data, some other memory devices, such as resistive random access memory (RRAM), phase change RAM (PRAM), and magnetic RAM (MRAM), use change in resistivity of a material therein to store data.

A resistive memory cell generally includes a first electrode, a second electrode, and a variable resistivity material connected therebetween. The resistive memory cell can be configured so that the resistivity of the material is controlled in response to a voltage that is applied between the first and second electrodes.

A PRAM device may include a phase changeable material layer which functions as a variable resistivity material. In response to sufficient heat, the phase changeable material layer may change phase so that its resistance changes and remains changed after its temperature returns to a pre-heating level. The phase changeable material layer may be formed from a chalcogenide material that includes germanium (Ge), antimony (Sb), and/or tellurium (Te) ("GST"). The phase of the material can be controlled in response to a level of current and/or duration of current that is applied to an electrode to heat the material a sufficient amount to change its phase.

The resistance of the phase changeable material layer varies in response to its phase changes. For example, when the phase changeable material has crystalline characteristics, its resistance can be substantially less than when the phase changeable material layer has amorphous characteristics. Accordingly, the resistance of the phase changeable material in a PRAM device is controlled to store a logic value and is sensed to read the logic value.

SUMMARY OF THE INVENTION

Various embodiments of the present invention are directed to methods of fabricating an integrated circuit memory cell. In some embodiments thereof, an amorphous variable resistivity material is formed on a first electrode. A crystalline variable resistivity material is formed on the amorphous variable resistivity material. A second electrode is formed on the crystalline variable resistivity material.

During fabrication, the amorphous variable resistivity material can have a substantially slower growth rate than the crystalline variable resistivity material. Accordingly, formation of the variable resistivity material as a layer of crystalline variable resistivity material on a layer of amorphous variable resistivity material may reduce/avoid the formation of voids therein when the variable resistivity material is formed in contact openings and/or in other semi-enclosed areas of an integrated circuit memory cell. Such fabrication processes may thereby enable fabrication of integrated circuit memory cells having more uniform resistivity characteristics.

In some further embodiments, formation of the amorphous variable resistivity material can include a first process of a first deposition step in which hydrogen (H2) and an inert carrier gas carrying a germanium precursor and a tellurium precursor are fed onto the first electrode for a first time, where a ratio of hydrogen to inert carrier gas is a first value. In a second process of the first deposition step, hydrogen and an inert carrier gas carrying an antimony precursor and a tellurium precursor are fed onto the first electrode for a second time, where a ratio of hydrogen to inert carrier gas is a second value.

Formation of the crystalline variable resistivity material on the amorphous variable resistivity material can include a first process of a second deposition step in which hydrogen and an inert carrier gas carrying a germanium precursor and a tellurium precursor are fed onto the amorphous variable resistivity material for a third time that is greater than the first time, where a ratio of hydrogen to inert carrier gas is a third value that is less than the first value. In a second process of the second deposition step, hydrogen and an inert carrier gas carrying a antimony precursor and a tellurium precursor are fed onto the amorphous variable resistivity material for a fourth time that is greater than the second time, where a ratio of hydrogen to inert carrier gas is a fourth value that is less than the second value.

In some further embodiments, in the first process of the second deposition step to form the crystalline variable resistivity material, the third time, during which the inert carrier gas carries the germanium precursor and the tellurium precursor onto the amorphous variable resistivity material, can be about 1.5 times to about 5 times greater than the first time; and in the second process of the second deposition step to form the crystalline variable resistivity material, the fourth time, during which the inert carrier gas carries the antimony precursor and the tellurium precursor onto the amorphous variable resistivity material, can be about 1.5 times to about 5 times greater than the second time.

In some further embodiments, in the first process of the second deposition step to form the crystalline variable resistivity material, the third value of the ratio of hydrogen to inert carrier gas can be about 10 times to about 100 times less than the first value; and in the second process of the second deposition step to form the crystalline variable resistivity material, the fourth value of the ratio of hydrogen to inert carrier gas can be about 10 times to about 100 times less than the second value.

In some other embodiments, fabrication of an integrated circuit memory cell includes forming a first electrode on a substrate. An insulation layer is formed on the substrate with an opening exposing at least a portion of the first electrode. An amorphous variable resistivity material is formed on the first electrode and extending away from the first electrode along sidewalls of the opening. A crystalline variable resistivity material is formed in the opening on the amorphous variable resistivity material. A second electrode is formed on the crystalline variable resistivity material.

In some further embodiments, the amorphous variable resistivity material can be formed to extend away from the first electrode along at least 50% of the sidewalls of the opening above the first electrode. The crystalline variable resistivity material can be formed to fill an interior area between sidewalls of the amorphous variable resistivity material in the opening. A nucleation promoting layer can be formed on the first electrode and extend along at least a major portion of sidewalls of the opening above the first electrode, where the amorphous variable resistivity material is formed on the nucleation promoting layer.

In some other embodiments, fabrication of an integrated circuit memory cell includes forming a first electrode. A first variable resistivity material is formed on the first electrode by a first process of a first deposition step that includes feeding hydrogen and an inert carrier gas carrying a germanium precursor and a tellurium precursor onto the first electrode for a first time, where a ratio of hydrogen to inert carrier gas is a first value. In a second process of the first deposition step, hydrogen and an inert carrier gas carrying an antimony precursor and a tellurium precursor are fed onto the first electrode for a second time, where a ratio of hydrogen to inert carrier gas is a second value. A second variable resistivity material is formed on the first variable resistivity material by a first process of a second deposition step that includes feeding hydrogen and an inert carrier gas carrying a germanium precursor and a tellurium precursor onto the first variable resistivity material for a third time that is greater than the first time, and in a second process of the second deposition step, feeding hydrogen and an inert carrier gas carrying a antimony precursor and a tellurium precursor onto the first variable resistivity material for a fourth time that is greater than the second time. A second electrode is formed on the second variable resistivity material.

In some further embodiments, a ratio of hydrogen to inert carrier gas is a third value that is less than the first value, and a ratio of hydrogen to inert carrier gas is a fourth value that is less than the second value.

In some further embodiments, the first variable resistivity material formed by the first and second processes of the first deposition step is an amorphous variable resistivity material, and the second variable resistivity material formed by the first and second processes of the second deposition step is a crystalline variable resistivity material.

In some further embodiments, the first and second processes of the first deposition step are alternately repeated a first number of times, and the first and second processes of the second deposition step are alternately repeated a second number of times that is greater than the first number of times. The first number of times can be less than 50 and the second number of times can be more than 60.

In some further embodiments, in the first process of the second deposition step to form the second variable resistivity material, the third time, during which the hydrogen and the inert carrier gas carrying the germanium precursor and the tellurium precursor are fed onto the first variable resistivity material, is about 1.5 times to about 5 times greater than the first time; and in the second process of the second deposition step to form the second variable resistivity material, the fourth time, during which the hydrogen and the inert carrier gas carrying the antimony precursor and the tellurium precursor are fed onto the first variable resistivity material, is about 1.5 times to about 5 times greater than the second time.

In some further embodiments, in the first process of the second deposition step to form the second variable resistivity material, the third value of the ratio of hydrogen to inert carrier gas is about 10 times to about 100 times less than the first value; and in the second process of the second deposition step to form the second variable resistivity material, the fourth value of the ratio of hydrogen to inert carrier gas is about 10 times to about 100 times less than the second value.

In some further embodiments, in the first process of the first deposition step to form the first variable resistivity material, the hydrogen and the inert carrier gas carrying the germanium precursor and the tellurium precursor are fed onto the first electrode for less than 0.2 seconds, where a ratio of hydrogen to inert carrier gas is greater than 2; and in the second process of the first deposition step to form the first variable resistivity material, the hydrogen and the inert carrier gas carrying the antimony precursor and the tellurium precursor are fed onto the first electrode for less than 0.2 seconds, where a ratio of hydrogen to inert carrier gas is greater than 2.

Some other embodiments are directed to an integrated circuit memory cell that includes a substrate, a conductive structure, a first electrode, an insulation layer, an amorphous variable resistivity material, a crystalline variable resistivity material, and a second electrode. The conductive structure is on the substrate, and the first electrode is on the conductive structure. The insulation layer has an opening that exposes the first electrode. The amorphous variable resistivity material is on the first electrode and extends away from the first electrode along sidewalls of the opening. The crystalline variable resistivity material is in the opening on the amorphous variable resistivity material. The second electrode is on the crystalline variable resistivity material.

BRIEF DESCRIPTION OF THE DRAWINGS

The above and other features and potential advantages of the present invention will become readily apparent by reference to the following detailed description when considered in conjunction with the accompanying drawings wherein.

DETAILED DESCRIPTION

Figure 1:
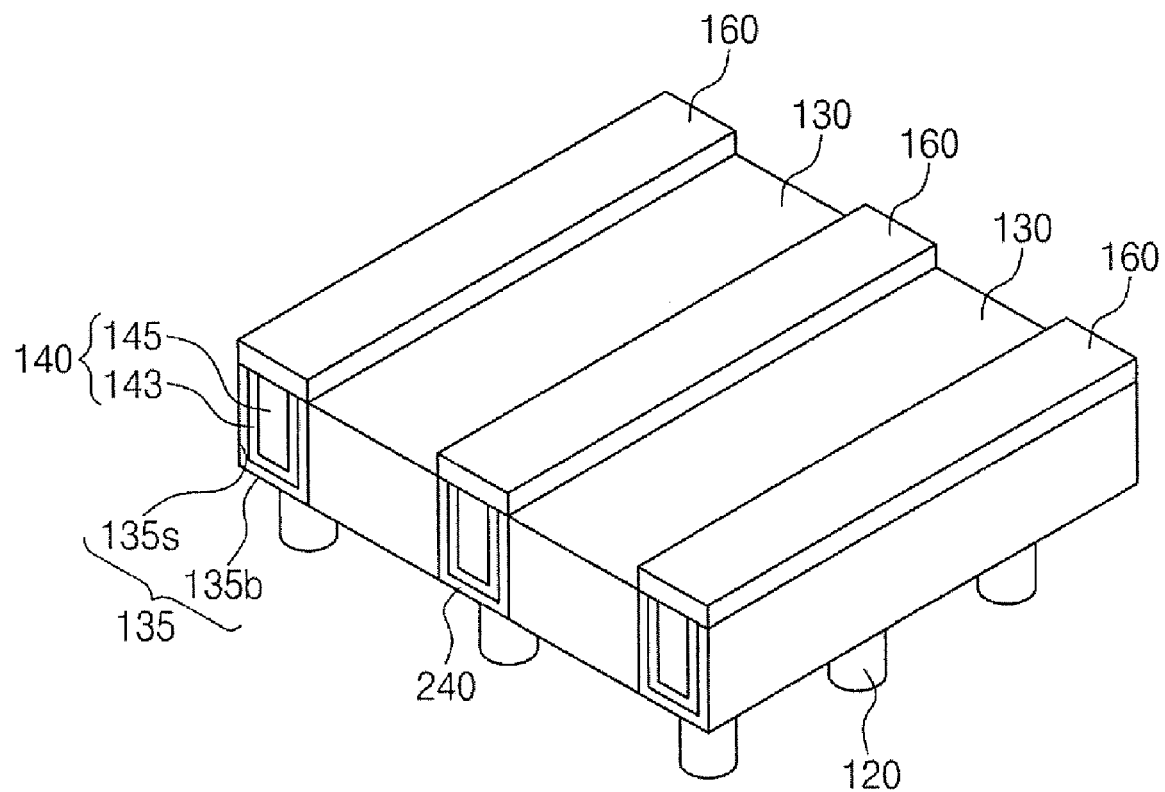
FIGS. 1-3 are cross-sectional views illustrating alternate embodiments of integrated circuit memory cells that are configured in accordance with some embodiments of the present invention.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," "connected to" and/or "coupled to" another element or layer, the element or layer may be directly on, connected and/or coupled to the other element or layer, or intervening elements or layers may be present. In contrast, when an element is referred to as being "directly on," "directly connected to" and/or "directly coupled to" another element or layer, no intervening elements or layers are present. As used herein, the term "and/or" includes any and all combinations of one or more of the associated listed items.

It will also be understood that, although the terms "first," "second," etc., may be used herein to describe various elements, components, regions, layers and/or sections, these elements, components, regions, layers and/or sections should not be limited by these terms. Rather, these terms are used merely as a convenience to distinguish one element, component, region, layer and/or section from another element, component, region, layer and/or section. For example, a first element, component, region, layer and/or section could be termed a second element, component, region, layer and/or section without departing from the teachings of the present invention.

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

The terminology used herein is for the purpose of describing particular embodiments only and is not intended to limit of the invention. As used herein, the singular terms "a," "an" and "the" are intended to include the plural forms as well, unless the context clearly indicates otherwise. It will be further understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention. Like reference numerals refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view that illustrates integrated circuit memory cells that are configured in accordance with some embodiments of the present invention. Referring to FIG. 1, a memory cell includes a plurality of first electrodes 120 that can extend into a substrate to electrically connect to regions/structures defined therein. An insulation layer 130 extends across the substrate and can be formed from, for example, silicon oxide and/or silicon nitride. Contact openings 135 with sidewalls 135s extend through the insulation layer 130 to expose the first electrodes 120 along a bottom 135b of the contact openings 135. A variable resistivity material fills the contact openings 135. Second electrodes 160 cover an upper surface of the variable resistivity material in the contact openings 135.

The variable resistivity material filling the contact openings 135 may include a phase changeable material such as a chalcogenide material that includes, for example, germanium, antimony, bismuth (Bi), and/or tellurium (e.g., Ge—Sb—Te (GST) or Ge—Bi—Te (GBT)). In accordance with some embodiments of the present invention, the variable resistivity material includes crystalline variable resistivity material 145 that is formed on amorphous variable resistivity material 143. The amorphous variable resistivity material 143 extends along the bottom 135b and sidewalls 135s of the contact opening 135. The crystalline variable resistivity material 145 is formed on the amorphous variable resistivity material 143 and fills the remaining portion of the contact opening 135. Accordingly, the second electrodes are electrically connected to the first electrodes 120 through the crystalline variable resistivity material 145 and the amorphous variable resistivity material 143.

The crystalline variable resistivity material 145 can be configured to have higher heat conductivity and/or lower resistivity than the amorphous variable resistivity material 143.

As will be further explained below, formation of the crystalline variable resistivity material 145 on a layer of the amorphous variable resistivity material 143 may reduce/avoid formation of voids when filling the contact opening 135 with the variable resistivity material.

In some further embodiments, the amorphous variable resistivity material 143 may be formed on a nucleation promoting layer 240. The nucleation promoting layer 240 may therefore be interposed between the amorphous variable resistivity material 143 and the insulation layer 130 and the first electrodes 120.

The nucleation promoting layer 240 may facilitate formation of an initial layer of amorphous rather than crystalline variable resistivity material within the contact opening 135. Although the nucleation promoting layer 240 can be formed from an insulation material, vacancies therein can enable current to flow between the first electrodes 120 and the amorphous variable resistivity material 143. The nucleation promoting layer 240 may include a metal oxide that has a high electrical resistance (e.g., between about $1 \times 10^6 \Omega$ to about $1 \times 10^9 \Omega$) and may have good step coverage to facilitate atomic layer deposition (ALD) of the nucleation promoting layer 240 as a uniform thin layer in the contact opening 135. The nucleation promoting layer 240 may be a substantially amorphous material and may include, for example, TiOx, NbOx, and/or ZrOx.

Figure 2:
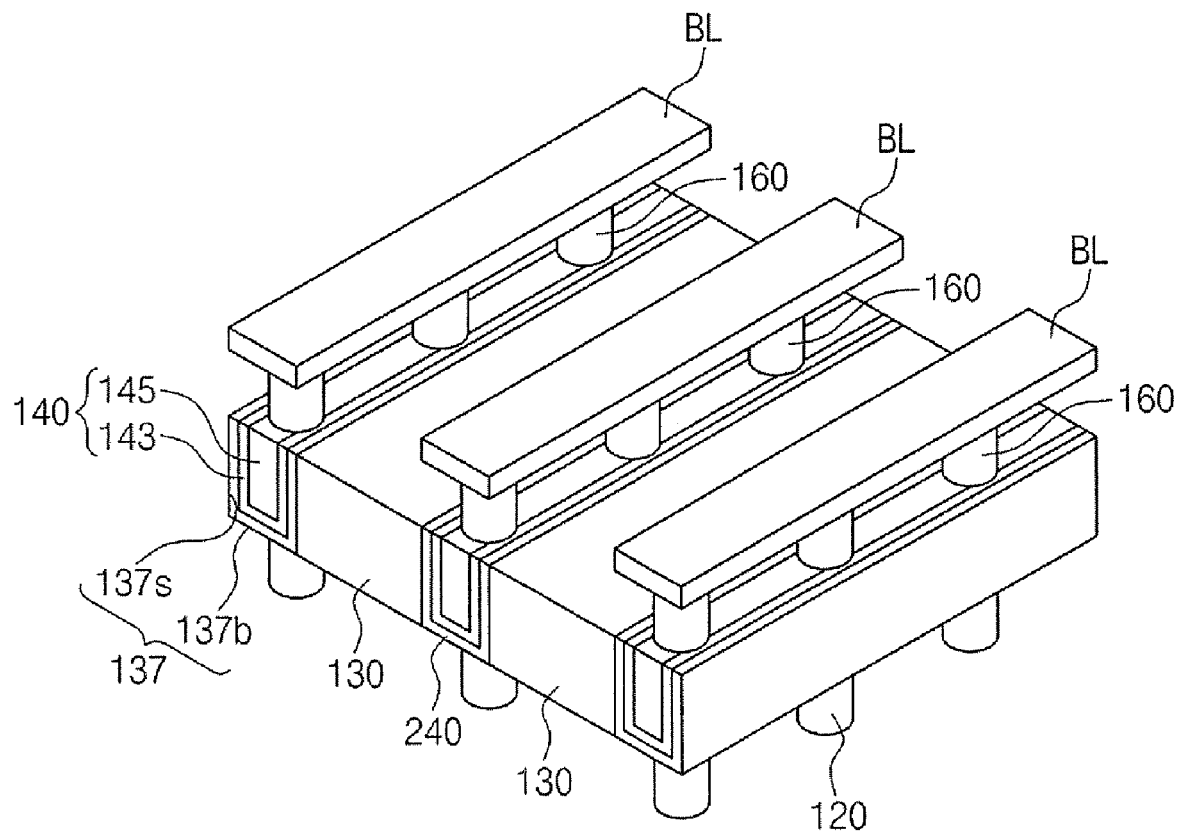
Figure 3:
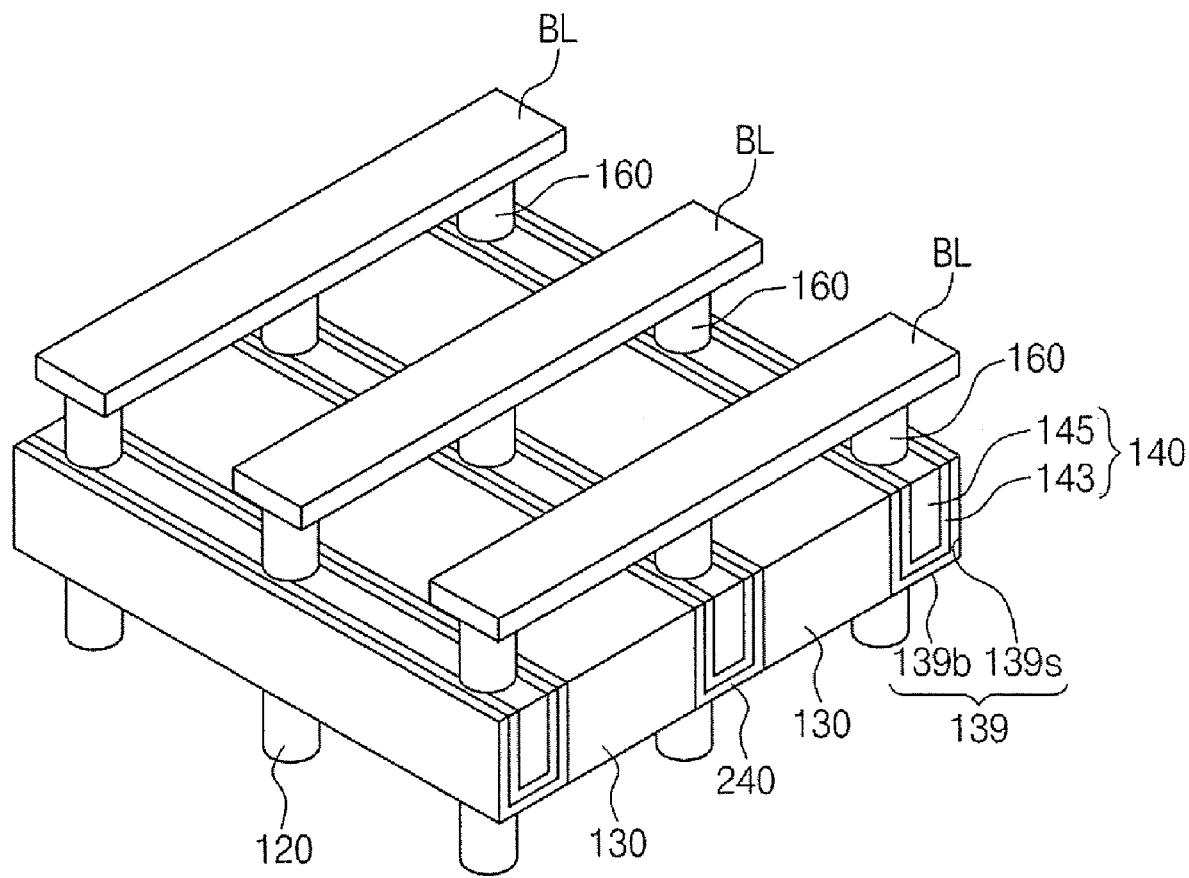

FIGS. 2 and 3 are cross-sectional views that illustrate integrated circuit memory cells that are configured in accordance with some other embodiments of the present invention, and that include many of the same elements described-above for FIG. 1 and which have the same reference numbers. The integrated circuit memory cells of FIGS. 2 and 3 include stacked layers of a nucleation promoting layer 240, an amorphous variable resistivity material 143, and a crystalline variable resistivity material 145 that fill contact openings (contact openings 137 in FIG. 2 and contact openings 139 in FIG. 3) which expose first electrodes 120. In contrast to the integrated circuit memory cells of FIG. 1, in FIG. 2 a plurality of bit lines BL extend parallel to and connect through second electrodes 160 to lines of the variable resistivity material. In FIG. 3, a plurality of bit lines BL extend across and connect through second electrodes 160 to parallel extending lines of the variable resistivity material.

FIGS. 4-6 and 9-10 are cross-sectional views illustrating methods of fabricating integrated circuit memory cells, such as the memory cells of FIGS. 1-3, in accordance with some embodiments of the present invention.

Figure 4:
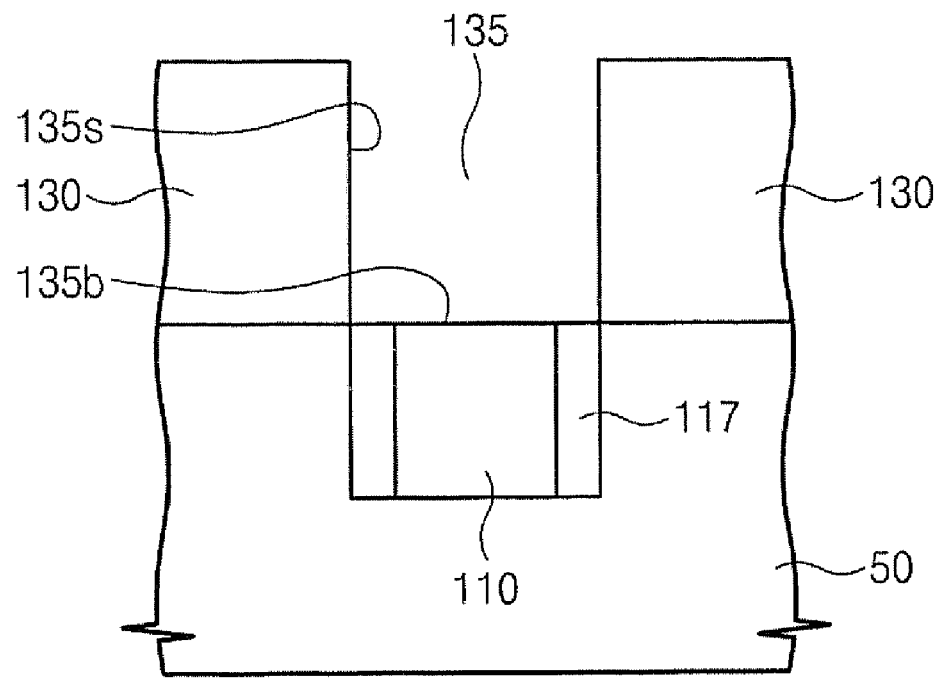
FIGS. 4-6 and 9-10 are cross-sectional views illustrating methods of fabricating integrated circuit memory cells, such as the memory cells of FIGS. 1-3, in accordance with some embodiments of the present invention.

Referring to FIG. 4, a first electrode 110 is formed in a substrate 50 to contact a defined region/pattern/structure therein, such as a conductive structure, impurity region, source/drain region/terminal of a transistor, etc. Sidewall spacers 117 insulate sidewalls of the first electrode 110 from the substrate 50. The first electrode 110 may be formed from, for example, doped polysilicon, metal (W, Al, Cu, Ta, Ti, Mo, etc.), and/or metal nitride (WNx, AlNx, TiNx, TaNx, MoNx, NbNx, TiSiNx, TiAlNx, TiBNx, ZrSiNx, WSiNx, WBNx, ZrAlNx, MoSiNx, MoAlNx, TaSiNx, TaAlNx, etc.). Alternatively, the first electrode 110 may be a vertical diode that includes a lower diode region and an upper diode region having opposite impurity types.

An insulation layer 130 is formed on the substrate 50. A contact opening 135 with sidewalls 135s is formed in the insulation layer 130 to expose at least a portion of the first electrode 110 along a bottom 135b of the contact opening 135.

Figure 5:
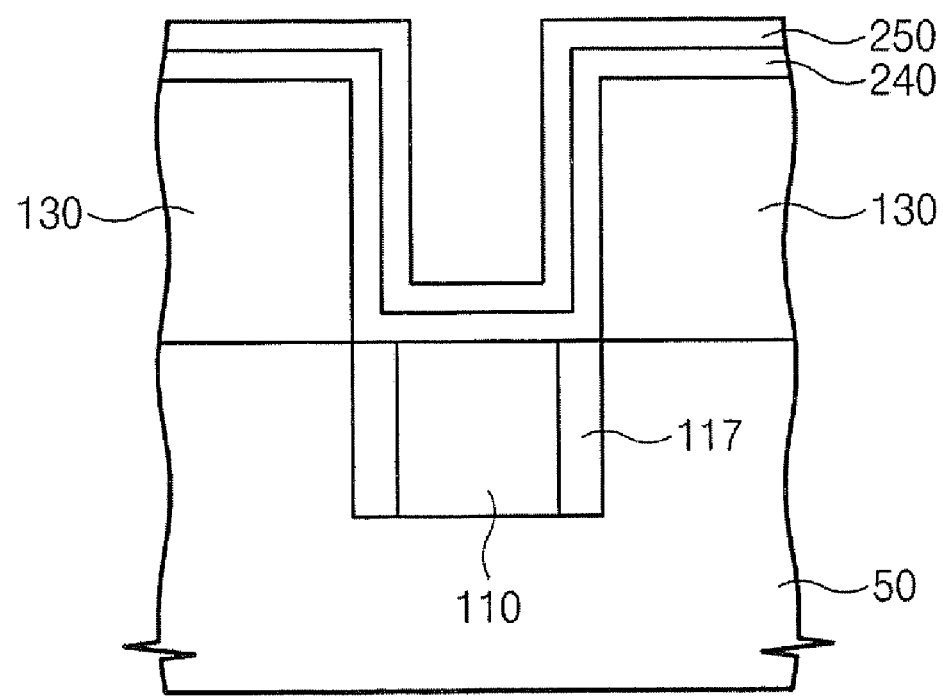
Figure 6:
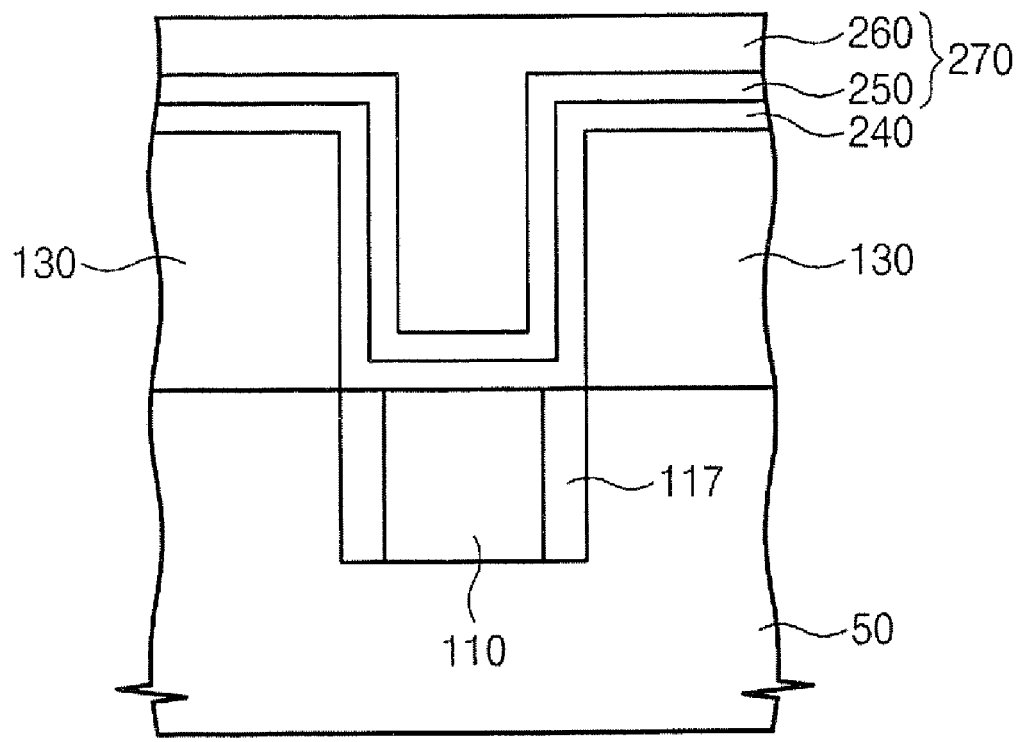

Referring to FIGS. 5 and 6, a nucleation promoting layer 240 is formed on the sidewalls 135s and along the bottom 135b of the contact opening 135. The nucleation promoting layer 240 may be formed through an atomic layer deposition process, and, as described above, may be formed from a metal oxide (e.g., TiOx, NbOx, and/or ZrOx) that has a high electrical resistance (e.g., between about $1 \times 10^6 \Omega$ to about $1 \times 10^9 \Omega$) and has good step coverage to facilitate atomic layer deposition of the nucleation promoting layer 240 as a uniform thin layer in the contact hole 135. Formation of the nucleation promoting layer 240 may be omitted from the integrated circuit memory cells in accordance with some embodiments of the present invention.

An amorphous variable resistivity material layer 250 is formed on the nucleation promoting layer 240 in the contact opening 135. The amorphous variable resistivity material layer 250 may be formed along a bottom 135b and along a major portion, such as long at least 50%, of the sidewalls 135s of the contact opening 135 above the first electrode 110. A crystalline variable resistivity material layer 260 is formed on the amorphous variable resistivity material layer 250 to fill an interior area between sidewalls of the amorphous variable resistivity material layer 250 in the contact opening 135. The stacked amorphous variable resistivity material layer 250 and crystalline variable resistivity material layer 260 collectively form a variable resistivity structure 270.

The amorphous variable resistivity material layer 250 may be formed with a lower lateral growth rate (across the contact opening 135) and with a higher nucleation density than the crystalline variable resistivity material layer 260. These and other characteristics of the amorphous variable resistivity material layer 250 may enable formation of the variable resistivity structure 270 to fill the contact opening 135 while avoiding/reducing occurrence of voids therein.

Figure 9:
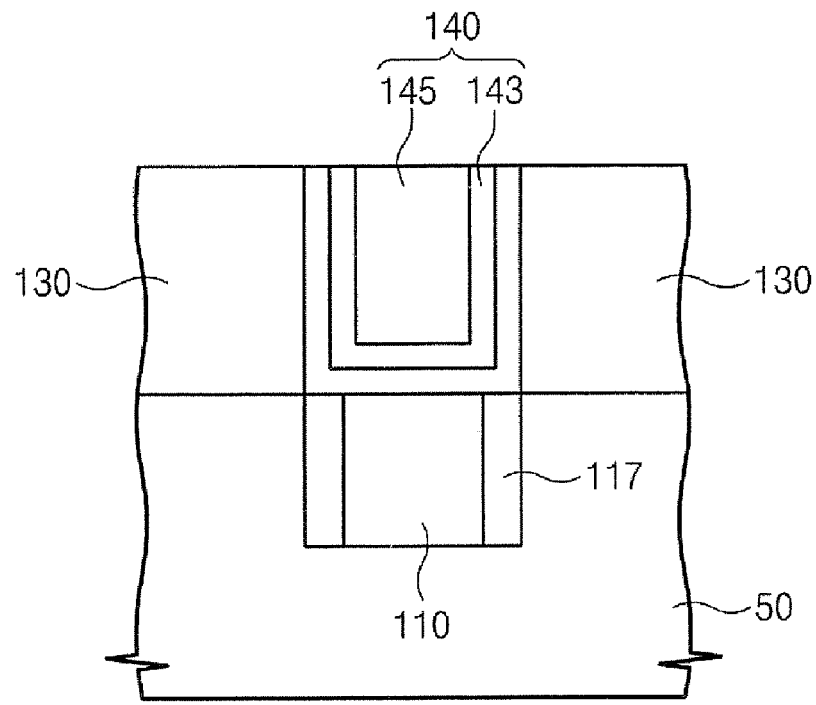

Referring to FIG. 9, the nucleation promoting layer 240, the amorphous variable resistivity material layer 250, and the crystalline variable resistivity material layer 260 can be etched back to expose an upper surface of the insulation layer 130. A variable resistivity structure 140 can thereby be formed that has an amorphous variable resistivity material pattern 143 and a crystalline variable resistivity material pattern 145 that fill the contact opening 135 and have upper surfaces that are aligned with the upper surface of the insulation layer 130.

Figure 10:
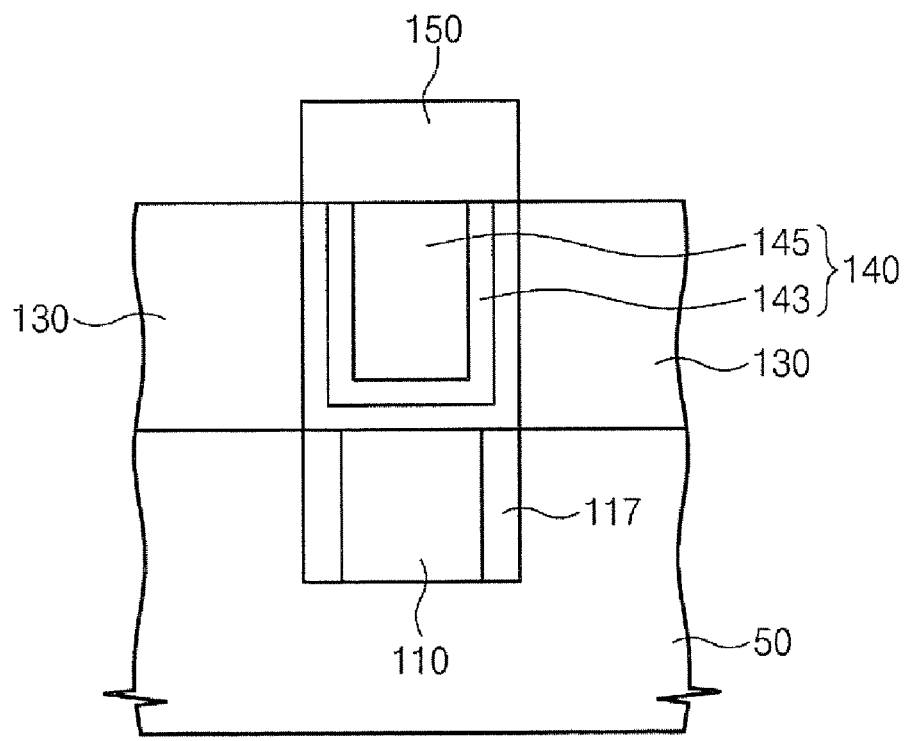

Referring to FIG. 10, a second electrode 150 is formed on the variable resistivity structure 140. Accordingly, the variable resistivity structure 140 is electrically connected between the second electrode 150 and the first electrode 110.

Figure 7:
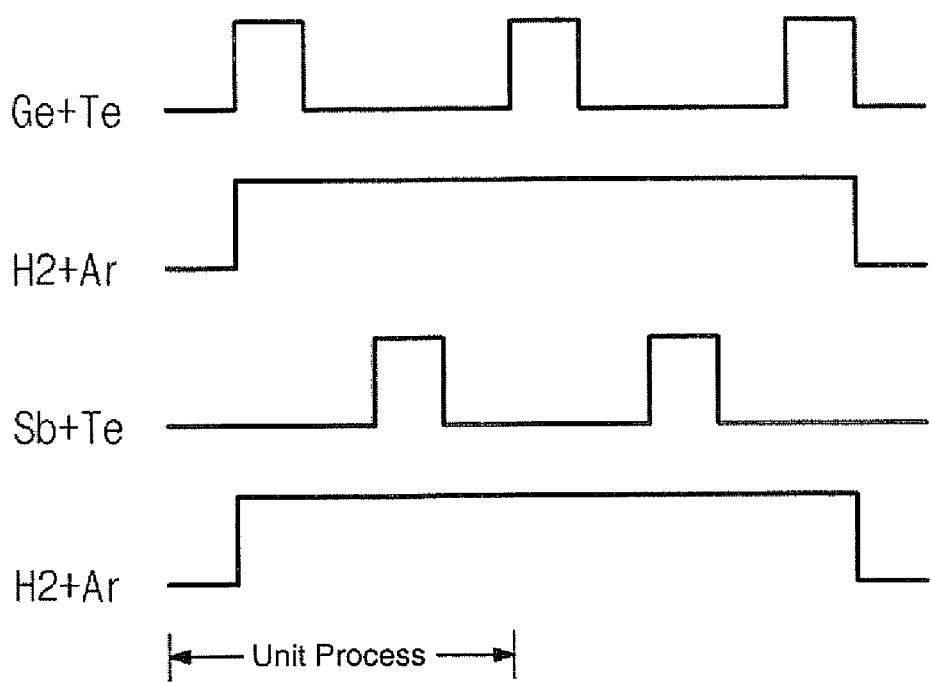
FIG. 7 is a timing diagram illustrating methods of forming a variable resistivity material in accordance with some embodiments of the present invention.

FIG. 7 is a timing diagram that illustrates a unit process that may be repetitively carried out to form the variable resistivity structure 270 of FIG. 7 in accordance with some embodiments of the present invention.

Referring to FIG. 7, the amorphous variable resistivity material layer 250 of FIG. 5 may be formed by repetitively carrying out first and second process of a first deposition step. The crystalline variable resistivity material 260 of FIG. 6 may be formed on the amorphous variable resistivity material layer 250 by repetitively carrying out first and second processes of a second deposition step. Some embodiments of the present invention may arise from a discovery that the duration of these steps and the ratio of hydrogen (H2) to inert gas which carries materials which form the variable resistivity material can be regulate to selectively cause either an amorphous variable resistivity material to be formed or a crystalline variable resistivity material to be formed.

To form an amorphous variable resistivity material, the first process of the first deposition step can include feeding hydrogen and argon, or another inert carrier gas, simultaneously carrying a germanium precursor and a tellurium precursor onto the structure (e.g., onto the nucleation promoting layer 240) of FIG. 6, for a first time, and where a ratio of hydrogen to argon is a first value. The first time may be, for example, less than about 0.2 seconds. The first process forms a germanium-tellurium composite layer on the nucleation promoting layer 240.

The second process of the first deposition step can include feeding hydrogen and argon, or another inert carrier gas, simultaneously carrying an antimony precursor and a tellurium precursor onto the structure for a second time, and where a ratio of hydrogen to argon is a second value. The second time may be, for example, less than about 0.2 seconds. The second process forms an antimony-tellurium composite layer on the germanium-tellurium composite layer formed by the first process.

To promote formation of the amorphous variable resistivity material, the second deposition step may be carried out with a hydrogen deficient feeding gas, such as, for example, where a ratio of hydrogen to argon may be greater than 2.

The first and second processes of the first deposition step can be alternately repeated to grow a desired thickness of the amorphous variable resistivity material layer 250, as a germanium-antimony-tellurium composite layer (e.g., $Ge_xSb_yTe_z$) on the nucleation promoting layer 240 in the contact opening 135. Accordingly, although the gases carrying the precursors are initially fed onto an exposed surface of the nucleation promoting layer 240 during the first process, during the second process and any subsequent repetitions of the first and second processes, the gases carrying the precursors are fed onto the growing layers of amorphous variable resistivity material.

It is to be understood that the amorphous variable resistivity material may be formed directly on the first electrode 110 (e.g., when the nucleation promoting layer 240 is omitted) by feeding the gases carrying the precursors onto the first electrode 110, or other layers may intervene between the amorphous variable resistivity material and the first electrode 110.

To form the crystalline variable resistivity material 260 on the amorphous variable resistivity material layer 250, first and second processes of a second deposition step are repetitively carried out. To promote formation of crystalline variable resistivity material, longer gas feeding pulse times and/or a hydrogen deficient feeding gas can be used. The first process of the second deposition step can include feeding hydrogen and argon, or another inert carrier gas, simultaneously carrying a germanium precursor and a tellurium precursor onto the structure for a third time that is greater than the first time. The ratio of hydrogen to argon can be a third value that is less than the first value to further promote formation of crystalline variable resistivity material. The second process of the second deposition step can include feeding hydrogen and argon, or another inert carrier gas, simultaneously carrying a antimony precursor and a tellurium precursor onto the structure for a fourth time that is greater than the second time. The ratio of hydrogen to argon can be a fourth value that is less than the second value to further promote formation of crystalline variable resistivity material. For example, the ratio of hydrogen to argon may be less than 2 during the first and second processes of the second deposition step.

In the first process of the second deposition step to form the crystalline variable resistivity material 260, the third time, during which hydrogen and argon carries the germanium precursor and the tellurium precursor onto the structure can be about 1.5 times to about 5 times greater than the first time. In the second process of the second deposition step to form the crystalline variable resistivity material 260, the fourth time, during which hydrogen and argon carries the antimony precursor and the tellurium precursor onto the structure, can be about 1.5 times to about 5 times greater than the second time. For example, the third and fourth times may each be greater than about 0.6 seconds.

In the first deposition step to form the amorphous variable resistivity material layer 250, the ratio of hydrogen to argon, or to another inert carrier gas, that simultaneously carries the germanium and tellurium precursors or the antimony and tellurium precursors can be regulated to be hydrogen rich, while, in contrast, in the second deposition step to form the crystalline variable resistivity material layer 260, the ratio of hydrogen to argon, or to another inert carrier gas, can be regulated to be hydrogen deficient.

For example, in the first process of the second deposition step to form the crystalline variable resistivity material 260, the third value of the ratio of hydrogen to argon can be about 10 times to about 100 times less than the first value, and in the second process of the second deposition step, the fourth value of the ratio of hydrogen to argon can be about 10 times to about 100 times less than the second value.

A flow rate of the process gases and/or content of precursors therein may be regulated during formation of the amorphous variable resistivity material layer 250 and the crystalline variable resistivity material layer 260 so that an atomic % ratio of Ge in the first variable resistivity material to Ge in the second variable resistivity material is greater than 1. Alternatively or additionally, the flow rate of the process gases and/or content of precursors therein may be regulated so that an atomic % ratio of antimony in the first variable resistivity material to antimony in the second variable resistivity material is less than 1. Alternatively or additionally, the flow rate of the process gases and/or content of precursors therein may be regulated so that an atomic % ratio of Ge in the first variable resistivity material to antimony in the first variable resistivity material is greater than 1.

The first and second processes of the second deposition step can be alternately repeated to fill the contact opening 135 with crystalline variable resistivity material 260 on the amorphous variable resistivity material layer 250. For example, the first and second processes of the first deposition step may be alternately repeated less than 50 times to form the amorphous variable resistivity material layer 250, and the first and second processes of the second deposition step may be alternately repeated more than 60 times to form the crystalline variable resistivity material layer 260.

The amorphous variable resistivity material layer 250 and the crystalline variable resistivity material 260 may be formed within a chamber without breaking vacuum seal. The precursors can be purged from the chamber using at least the inert carrier gas, which continues to flow, between the first and second processes of the first deposition step and between the first and second processes of the second deposition step.

As described above, the amorphous variable resistivity material layer has a lower growth rate than the crystalline variable resistivity material layer. Accordingly, the variable resistivity structure 270 can be formed by initially forming the amorphous variable resistivity material at a relatively slow rate in the contact opening 135, and next forming the crystalline variable resistivity material at a relatively higher rate to fill the remaining portion of the contact opening 135. This filling process may thereby reduce/avoid the occurrence of voids in the variable resistivity structure 270 within the contact opening 135.

Figure 8:
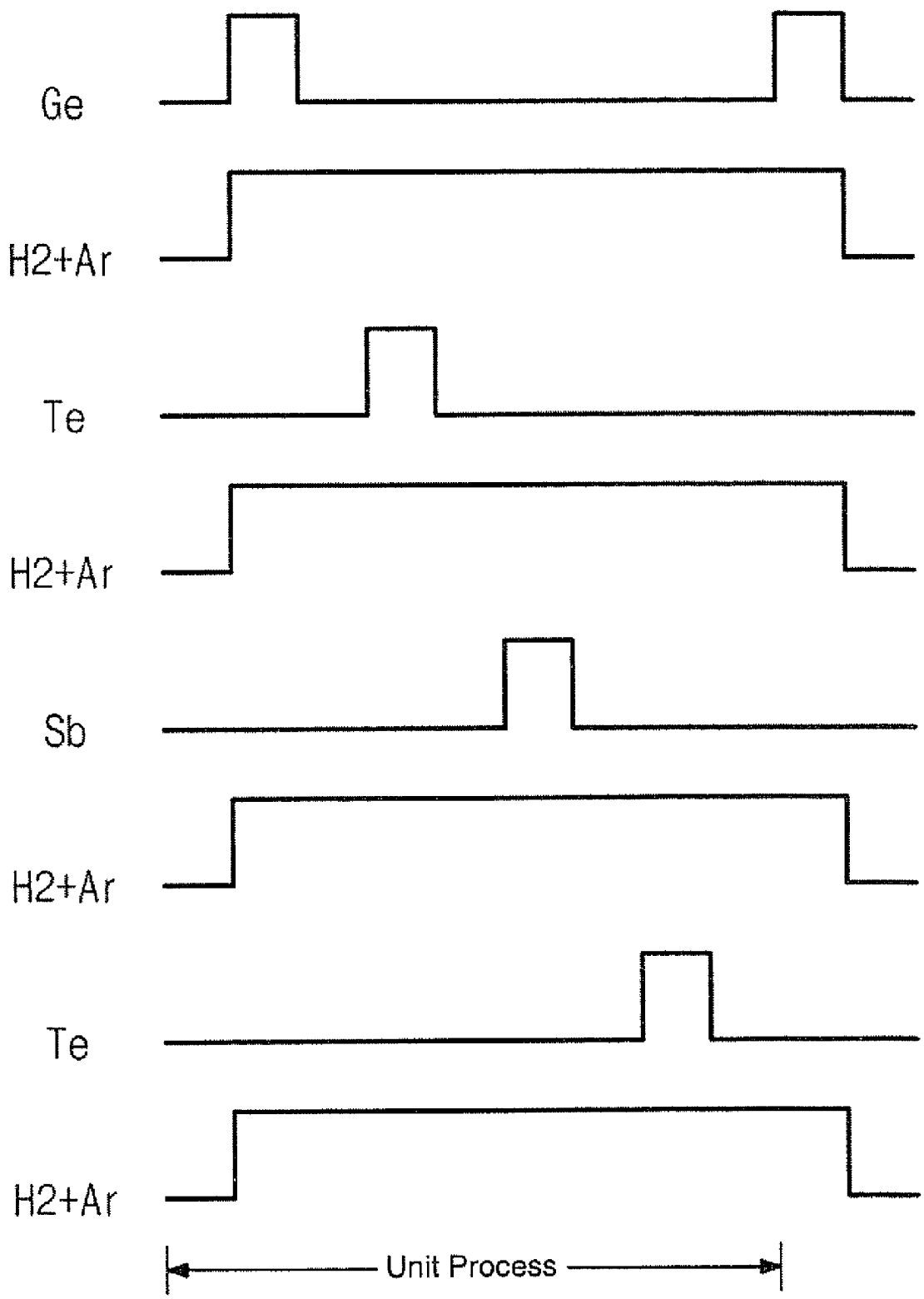
FIG. 8 is a timing diagram illustrating methods of forming a variable resistivity material in accordance with some other embodiments of the present invention.

In the first and second processes of the first and second deposition steps, instead of feeding hydrogen and argon simultaneously carrying a germanium precursor and a tellurium precursor and/or instead of feeding hydrogen and argon simultaneously carrying an antimony precursor and a tellurium precursor, the precursors may be separately carried onto the structures described above. FIG. 8 is a timing diagram illustrating methods of forming a variable resistivity material using separate process steps for separately carrying each of the germanium, tellurium, and antimony precursors in accordance with some other embodiments of the present invention.

Referring to FIG. 8, to form an amorphous variable resistivity material, the first process of the first deposition step described above with regard to FIG. 7 can be separated into one sub-process in which hydrogen and argon carrying a germanium precursor is fed onto the nucleation promoting layer 240, and another sub-process in which hydrogen and argon carrying a tellurium precursor is fed onto the nucleation promoting layer 240. Similarly, the second process of the first deposition described above with regard to FIG. 7 can be separated into one sub-process in which hydrogen and argon carrying an antimony precursor is fed onto the nucleation promoting layer 240, and another sub-process in which hydrogen and argon carrying a tellurium precursor is fed onto the nucleation promoting layer 240.

The first and second processes, including their respective sub-processes, of the first deposition step can be carried out and repeated as described above with regard to FIG. 7 to form the amorphous variable resistivity material layer 250.

Similarly, to form the crystalline variable resistivity material layer 260, the first process of the second deposition step described above with regard to FIG. 7 can be separated into one sub-process in which hydrogen and argon carrying a germanium precursor is fed onto the amorphous variable resistivity material layer 250, and another sub-process in which hydrogen and argon carrying a tellurium precursor is fed onto the amorphous variable resistivity material layer 250. Similarly, the second process of the second deposition described above with regard to FIG. 7 can be separated into one sub-process in which hydrogen and argon carrying an antimony precursor is fed onto the amorphous variable resistivity material layer 250, and another sub-process in which hydrogen and argon carrying a tellurium precursor is fed onto the amorphous variable resistivity material layer 250.

The first and second processes, including their respective sub-processes, of the second deposition step can be carried out and repeated as described above with regard to FIG. 7 to form the crystalline variable resistivity material layer 260.

Figure 11:
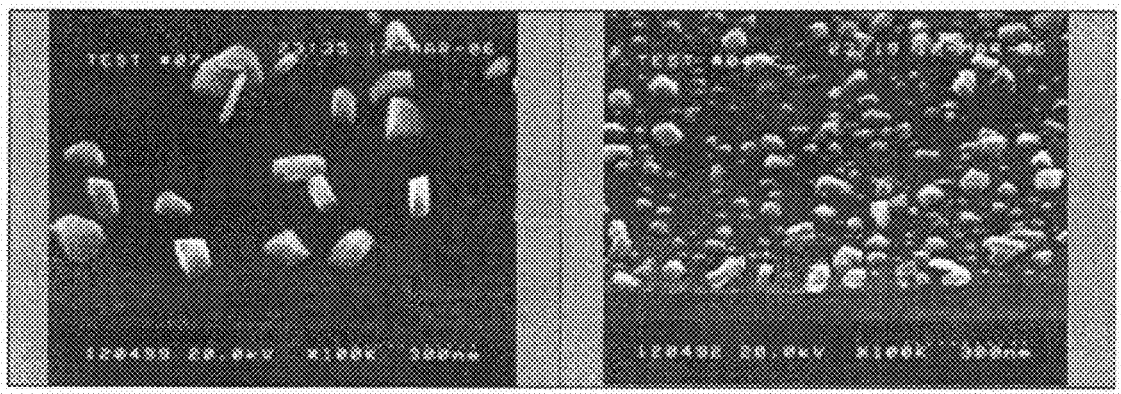
FIG. 11 shows transmission electron microscope pictures which illustrate nucleation density and corresponding surface morphology that may occur during a process cycle of a chemical vapor deposition step to form variable resistivity materials using two different ratios of hydrogen to argon gases when carrying deposition precursors.

FIG. 11 shows transmission electron microscope pictures which illustrate nucleation density and corresponding surface morphology that may occur during a thermal cycle of a chemical vapor deposition process of FIG. 7 to form variable resistivity materials using two different ratios of hydrogen to argon flow rates. In the left-hand photograph of FIG. 11, the hydrogen to argon flow rate ratio (H2/Ar) is about 0.24, and in the right-hand photograph the hydrogen to argon flow rate ratio is about 20. The photographs correspond to a phase changeable material that is formed when the unit process of FIG. 7 is repeated 10 times with one second of supply time of each reaction species during each unit process. It is observed in FIG. 11 that the nucleation density of the deposited phase changeable material increases as the hydrogen to argon flow rate ratio increases.

With continuing reference to FIG. 11, an amorphous phase changeable material can be formed when the hydrogen to argon flow rate ratio is 20 and a crystalline phase changeable material can be formed when the hydrogen to argon flow rate ratio is 0.24. Accordingly, to form an amorphous phase changeable material, the chemical vapor deposition process may be carried out with a relatively high ratio of hydrogen to argon, such as a ratio between about 10 to about 100. In contrast, to form a crystalline phase changeable material, the chemical vapor deposition process may be carried out with a relatively low ratio of hydrogen to argon, such as a ratio between about 1 to about 10.

Figure 12:
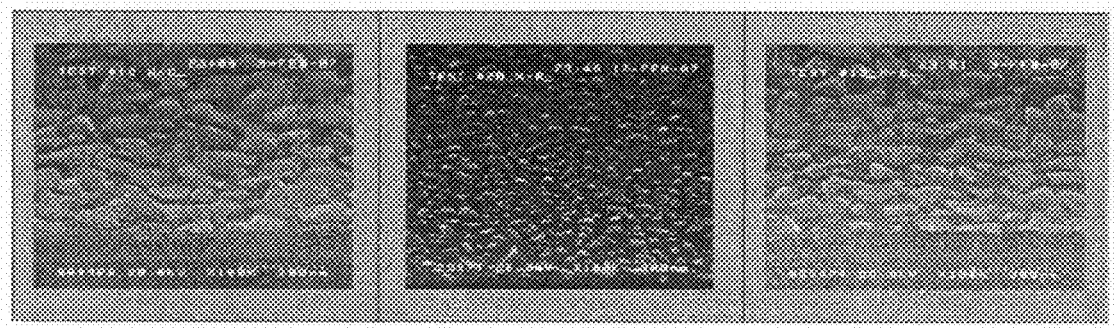
FIG. 12 shows transmission electron microscope pictures which illustrate nucleation density and corresponding surface morphology that may occur during a process cycle of a chemical vapor deposition step to form variable resistivity materials using three different ratios of hydrogen to argon flow rates when carrying deposition precursors.

FIG. 12 shows transmission electron microscope pictures which illustrate nucleation density and corresponding surface morphology that may occur during a process cycle of a chemical vapor deposition process of FIG. 7 to form variable resistivity materials using three different ratios of hydrogen to argon flow rates. Referring to FIG. 12, in the left photograph the hydrogen flow rate is about 100 cm$^3$/min, in the middle photograph the hydrogen flow rate is about 500 cm$^3$/min, and in the right photograph the hydrogen flow rate is about 1000 cm$^3$/min. The germanium and tellurium precursors are simultaneously fed for about 0.2 seconds, and the antimony and tellurium precursors are simultaneously fed for about 0.2 seconds. Each photograph corresponds to phase changeable material that is formed when the unit process of FIG. 7 is repeated 30 times with a supply time about 0.2 seconds for each reaction species process.

It is observed in FIG. 12 that when the hydrogen flow rate is low, for example, about 100 cm$^3$/m in, the number of nuclei of the phase changeable material in a unit area is small and is predominated by lateral growth. In contrast, when an the hydrogen flow rate is about 500 cm$^3$/min, the number of nuclei of the phase changeable material in the unit area increases relative to when the flow rate is about 100 cm$^3$/min. Accordingly, the ratio of hydrogen to argon flow rates can have a substantial effect on the nucleation density that can be obtained in the deposited variable resistivity material.

Figure 13:
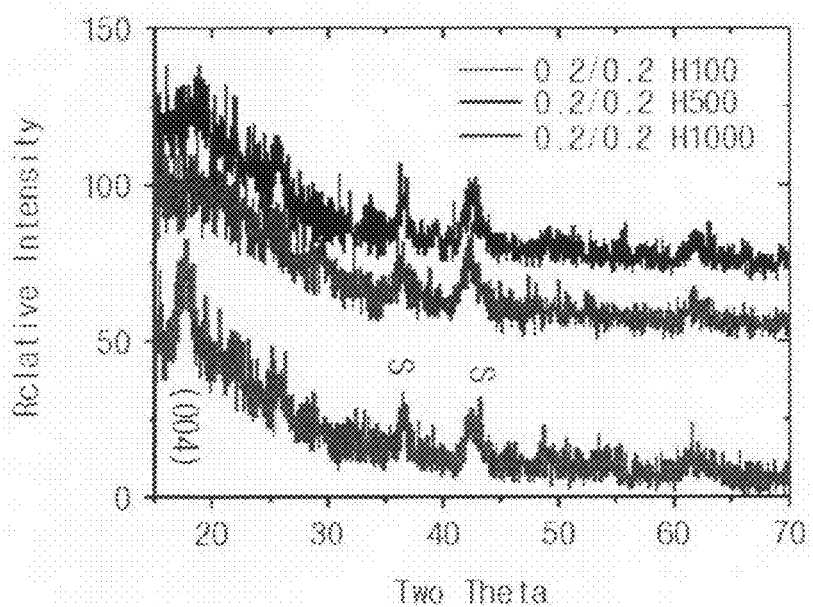
FIG. 13 shows graphs of X-ray diffraction patterns of variable resistivity materials of FIG. 12 that are formed using three different ratios of hydrogen to argon flow rates when carrying deposition precursors.

FIG. 13 shows graphs of X-ray diffraction patterns of variable resistivity materials that are formed in FIG. 12 using the three different ratios of hydrogen to argon gases. The bottom illustrated graph corresponds to a hydrogen flow rate of 100 cm$^3$/min (e.g., H2/Ar<2), the middle illustrated graph corresponds to a hydrogen flow rate of 500 cm$^3$/min (e.g., H2/Ar=2), and the top illustrated graph corresponds to a hydrogen flow rate of 1000 (e.g., H2/Ar=20). The illustrated peaks correspond to formation of crystalline variable resistivity material (hexagonal closed packed material), with the later occurring peaks identified by "S" corresponding to TiN. A ratio of hydrogen to argon of less than 2 resulted in formation of a crystalline variable resistivity material, as illustrated by the peak identified as (004) in the lowest illustrated graph corresponding to H2/Ar<2. It is observed that amorphous variable resistivity material can be formed in conditions where the ratio of hydrogen to argon is between 2 and 20. In contrast crystalline variable resistivity material is formed when the ratio of hydrogen to argon is less than 2.

Accordingly, a high hydrogen to argon flow rate ratio can be used to form an amorphous variable resistivity material layer during a first deposition step, and then a lower hydrogen argon flow rate ratio can be used to form a crystalline variable resistivity material layer on the amorphous variable resistivity material layer during a second deposition step. For example, the hydrogen to argon flow rate ratio of the first deposition step can be about two times to about 10 times higher than that used during the second deposition step.

Figure 14:
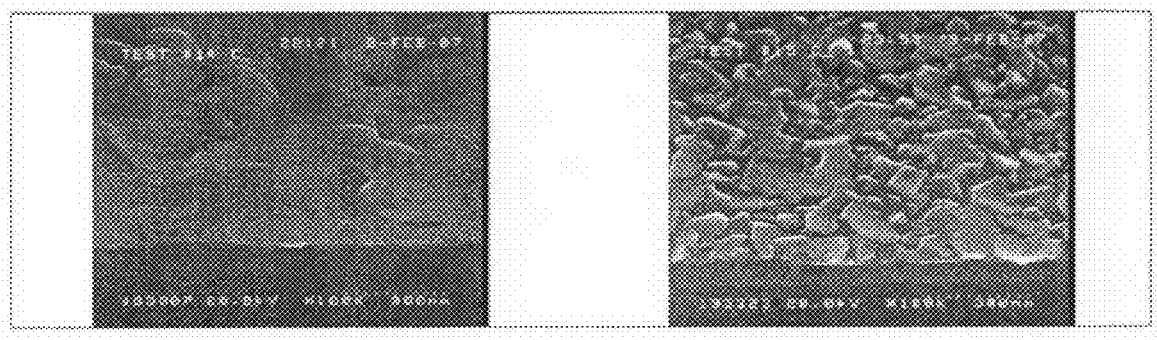
FIG. 14 shows transmission electron microscope pictures which illustrate nucleation density and corresponding surface morphology that may occur during a process cycle of a chemical vapor deposition step to form variable resistivity materials using two different ratios of hydrogen to argon flow rates.

FIG. 14 shows transmission electron microscope pictures which illustrate nucleation density and corresponding surface morphology that may occur during a process cycle of a chemical vapor deposition step of FIG. 7 to form variable resistivity materials using two different hydrogen flow rates. In the illustrated example, the germanium and tellurium precursors are simultaneously fed for about 0.5 seconds, and the antimony and tellurium precursors are simultaneously fed for about 0.5 seconds. The deposition steps are repetitively carried out for 30 cycles. The hydrogen flow rate is 100 cm$^3$/min in the left photograph and the hydrogen flow rate is 1000 cm$^3$/min in the right photograph. It is observed that in contrast to the phase changeable materials formed in FIG. 12, where the supply time of the reaction species was about 0.2 seconds, the phase changeable materials formed in FIG. 14 exhibit considerable lateral growth.

Figure 15:
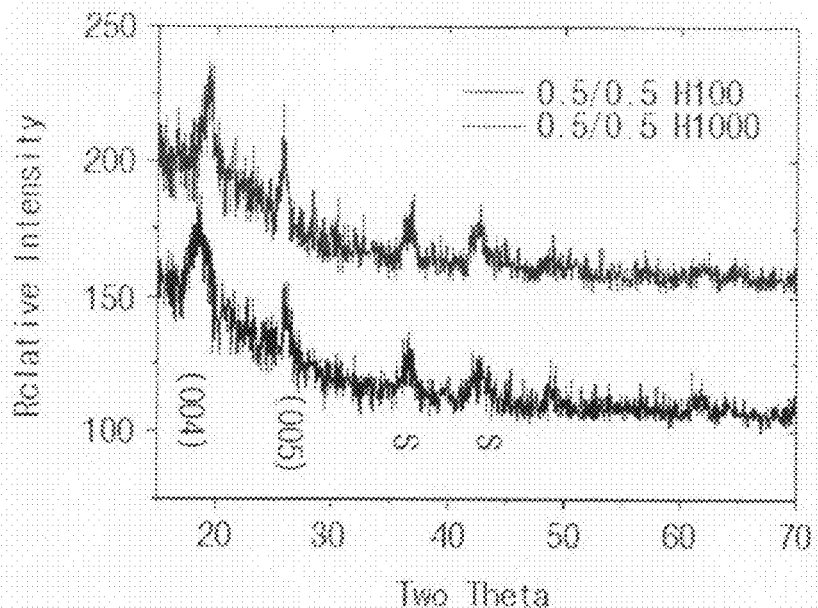
FIG. 15 shows graphs of X-ray diffraction patterns of variable resistivity materials of FIG. 14 that may be formed using two different ratios of hydrogen to argon flow rates when carrying deposition precursors.

FIG. 15 shows graphs of X-ray diffraction patterns of the variable resistivity materials of FIG. 14 that are formed using two different ratios of hydrogen to argon gases when carrying deposition precursors. The upper illustrated graph corresponds to a hydrogen flow rate of 100 cm$^3$/min (e.g., H2/Ar<2). The lower illustrated graph corresponds to a hydrogen flow rate of 1000 cm$^3$/min (e.g., H2/Ar=20). The peaks identified as (004) and (005) are observed to occur irrespective of an increase in the feeding time of the precursors from about 0.2 seconds to about 0.5 seconds (e.g., comparing FIGS. 12-13 to FIGS. 14-15), and irrespective of an increase in the ratio of hydrogen to argon. Accordingly, crystalline variable resistivity material (hexagonal closed packed material), not amorphous variable resistivity material is formed during these conditions. Thus, it has been discovered that an increased supply time of the reaction species can increase the degree of crystallization of the variable resistivity material that is formed. The feeding time of the precursors can therefore be an important factor controlling whether an amorphous variable resistivity material or a crystalline variable resistivity material is deposited from the precursors. The supply time of the reaction species in the first deposition step to form an amorphous variable resistivity material can be regulated to be shorter than the supply time of the reaction species in the second deposition step to form a crystalline variable resistivity material.

Figure 16:
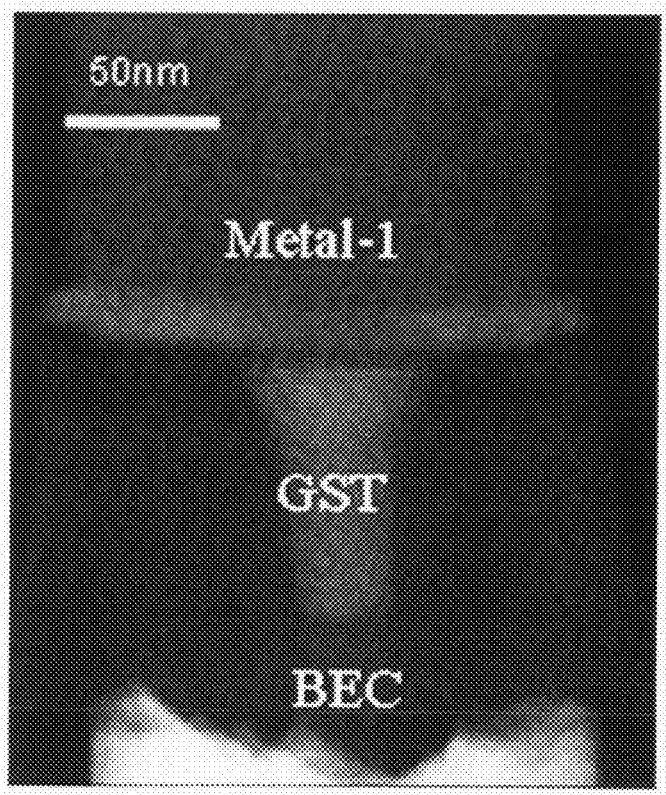
FIG. 16 shows a scanning electron microscope picture of a PRAM device that may be formed in accordance with some embodiments of the present invention.

FIG. 16 shows a scanning electron microscope picture of a PRAM device that includes a crystalline variable resistivity material that is formed on a layer of amorphous variable resistivity material in accordance with some embodiments of the present invention. Referring to FIG. 16, a phase changeable variable resistivity structure containing germanium, antimony, and tellurium ("GST") is formed between a bottom electrode conductor ("BEC") and an upper electrode conductor ("Metal-1"). For example, the GST material may be formed with a layer of amorphous GST material formed through the process of FIG. 7 repeated about 30 times with the reaction species supply time of 0.2 seconds and a hydrogen flow rate of 500 cm$^3$/min. Then, crystalline GST material is formed on the amorphous GST material through the process to FIG. 7 repeated about 80 times using a supply time of germanium and tellurium of about 1.2 seconds and a supply time of antimony and tellurium of about 0.7 seconds. It is observed that the variable resistivity structure GST appears to have been formed without occurrence of voids therein.

Figure 17:
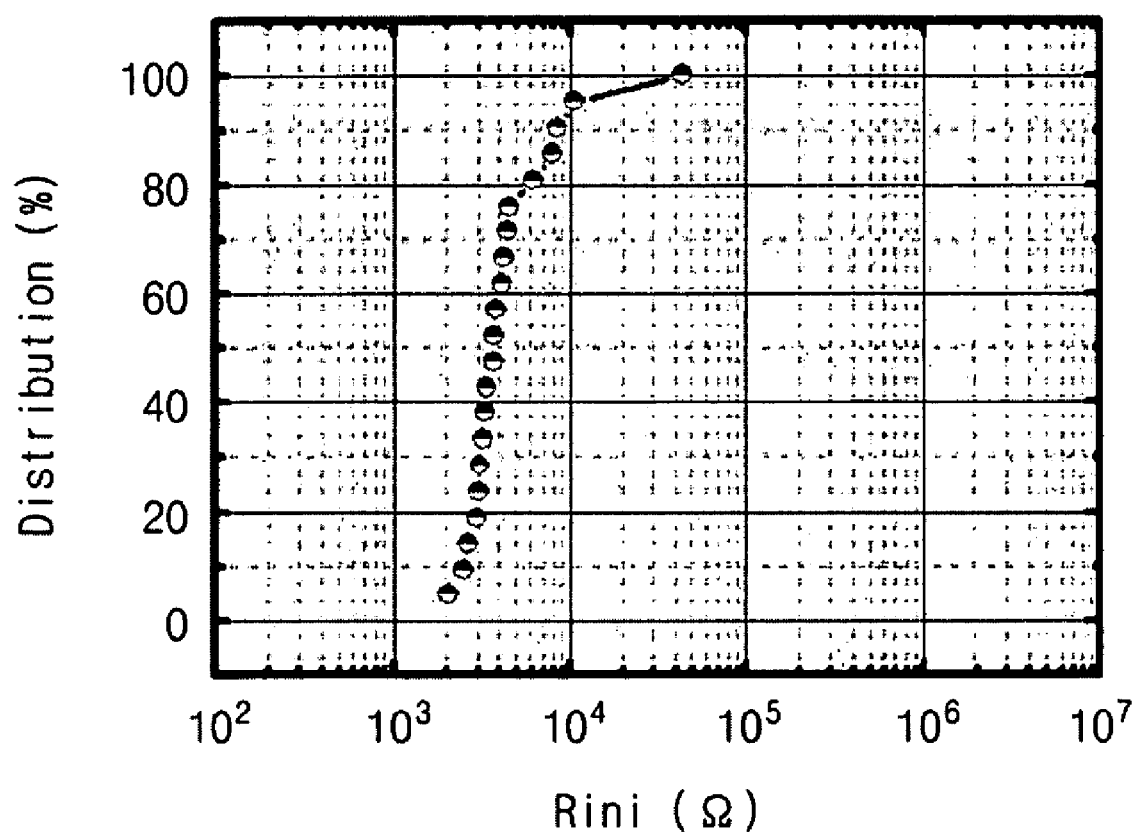
FIG. 17 is a graph comparing the distribution of resistance values of a PRAM device, such as the device shown in FIG. 16, that may be formed in accordance with some embodiments of the present invention.

FIG. 17 is a graph comparing the distribution of resistance values of a PRAM device, such as the device shown in FIG. 16, that may be formed in accordance with some embodiments of the present invention. It is observed that the resistance between the upper electrode conductor Metal-1 and the bottom electrode conductor BEC is below about 1 MΩ, and the distribution of resistance values between such devices in a plurality of memory cells is relatively small. Accordingly, various embodiments of the present invention may allow the fabrication of memory cells having more uniform characteristics.

Figure 18:
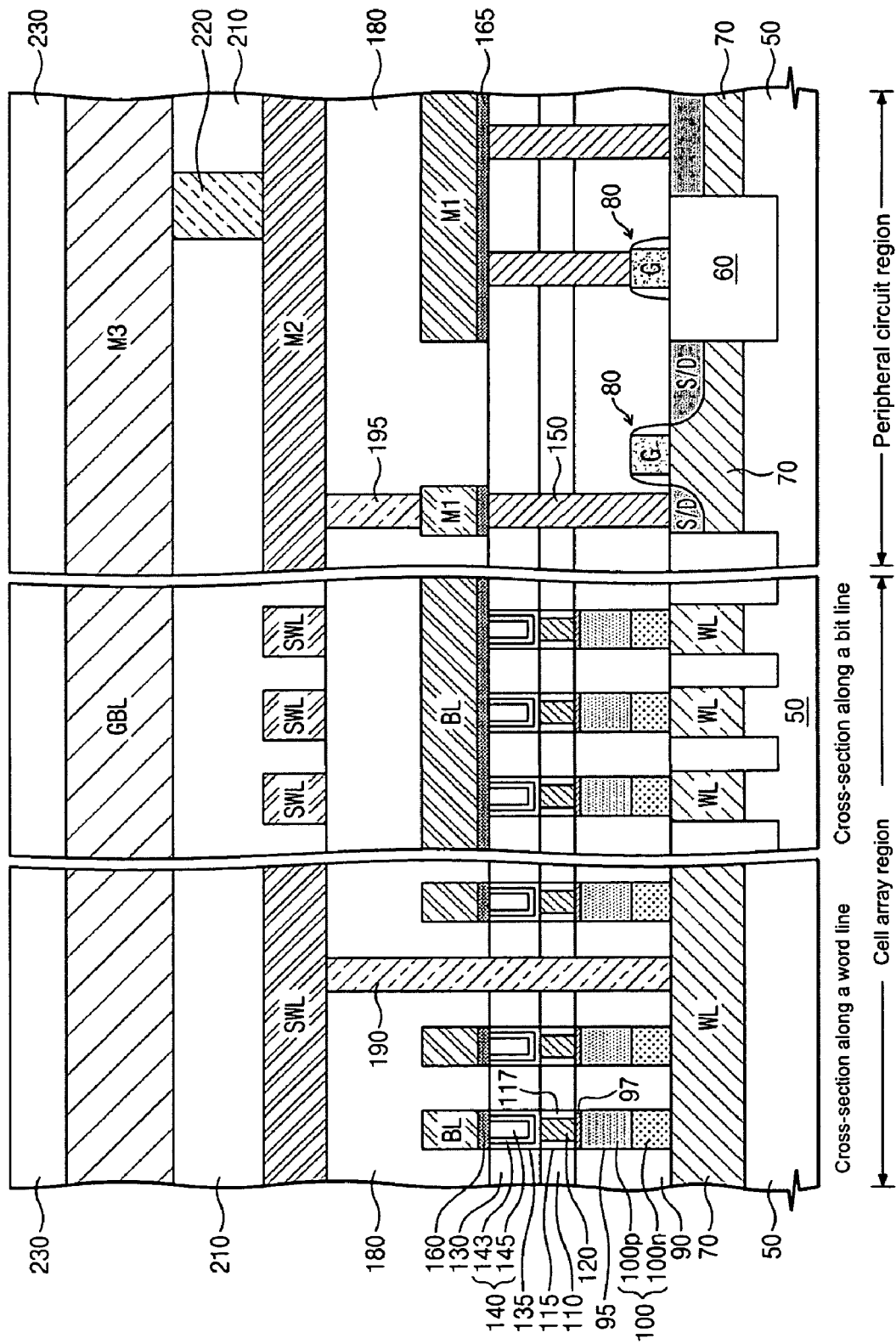
FIG. 18 is a cross-sectional view illustrating a memory cell region, which include a phase changeable memory device, and a peripheral circuit region in accordance with some embodiments of the present invention.

FIG. 18 is a cross-sectional view illustrating a memory cell region, which include a phase changeable memory device, and a peripheral circuit region in accordance with some embodiments of the present invention. The left drawing portion of the memory cell region illustrates a cross-section along the word line direction, the middle drawing portion illustrates a cross-section along the bit line direction, and the right drawing portion illustrates a cross section through the peripheral circuit region.

Referring to FIG. 18, a plurality of word lines WL are provided on a semiconductor substrate 50 in the memory cell array region. The word lines may, for example, be a semiconductor layer doped with n-type impurity. Alternatively, the word lines may be formed from a metallic thin film. Adjacent word lines may be electrically insulated from each other with an insulating layer, such as a device isolation layer 60. In the peripheral circuit region, a driving device, which is configured to drive the memory cell array region, is formed on the active region 70 defined by the device isolation layer 60. The driving device may include, for example, a drive transistor 80. A plurality of bit lines BL are provided on the substrate 50 in the memory cell array region and cross over the word lines. In the peripheral circuit region, a first metal wiring M1 corresponding to the bit line is provided. The first metal wiring M1 may be electrically connected to the gate of the drive transistor 80 and/or to a source/drain region S/D. The bit line BL and the first metal wiring M1 may be formed from a metallic thin film.

The word line may be provided within the substrate 50 or on the substrate 50. For example, the word line may be a semiconductor layer doped with an n-type impurity. When the word line is formed from a semiconductor layer, the semiconductor layer for the word line may be formed by doping a predetermined region of the substrate 50, may be formed by doping an epitaxial semiconductor layer after forming the epitaxial semiconductor, and/or may be formed by doping an impurity simultaneously with the formation of the epitaxial semiconductor layer. The word line (WL) may alternatively be formed from a metallic thin film.

In the peripheral circuit region, the first metal wiring M1 is electrically connected to the driving device, i.e., the gate G of the drive transistor 80 and the source/drain S/D through a contact plug 150. A phase changeable material layer 140 is positioned between the word line WL and the bit line BL. The phase changeable material layer 140 can be configured in accordance with one or more embodiments of the variable resistivity material layer described herein. The phase changeable material layer 140 includes a first phase changeable material layer 143 (i.e., an amorphous variable resistivity material layer) and a second phase changeable material layer 145 (i.e., a crystalline variable resistivity material layer)

Figure 19:
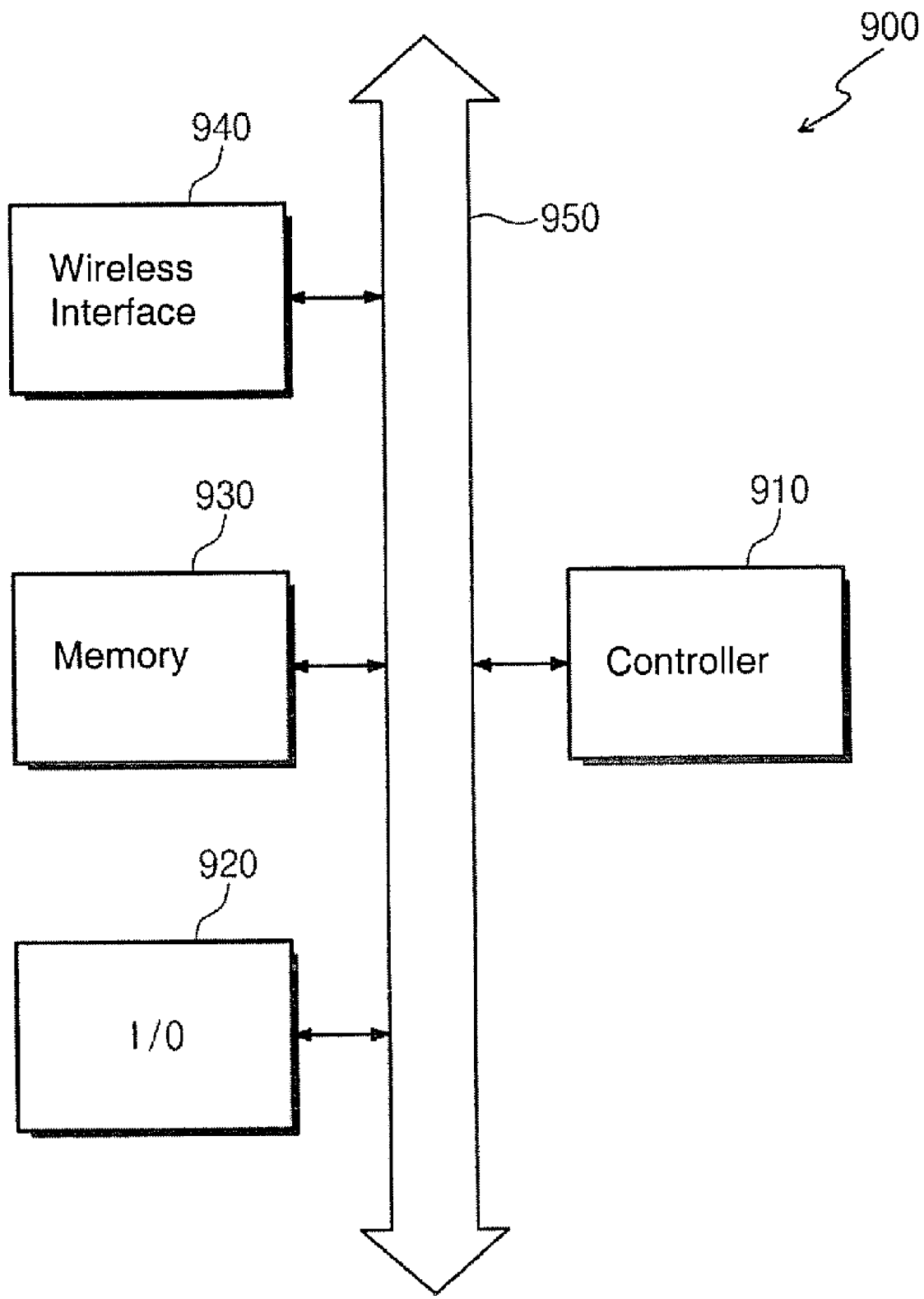
FIG. 19 is a block diagram of an electronic device that includes a memory that is configured in accordance with some embodiments of the present invention.

FIG. 19 is a block diagram of an electronic device 900 that includes a memory that is configured in accordance with some embodiments of the present invention. Referring to FIG. 19, the electronic device 900 includes a controller 910, an input/output (I/O) interface 920, a nonvolatile memory 930, and a wireless interface 940 which are interconnected by one or more communication buses 950.

The electronic device 900 may be, for example, any type of consumer electronic device. When the electronic device 900 is configured as a consumer electronic device, the controller 910 can be configured to provide various user applications which communicate with one or more users through the I/O interface 920. The I/O interface 920 may include, but is not limited to, a keyboard, a touch interface, a display, a speaker, and/or a microphone.

The wireless interface 940 may be configured to communicate with another electronic device via radio frequency and/or infrared signals. The controller 910, the I/O interface 920, and/or the wireless interface 940 may be configured to read/write data and/or program instructions in the nonvolatile memory 930.

The nonvolatile memory 930 is configured in accordance with at least one embodiment of the present invention. For example, the nonvolatile memory 930 may be configured as shown in one or more of FIGS. 1-18.

Figure 20:
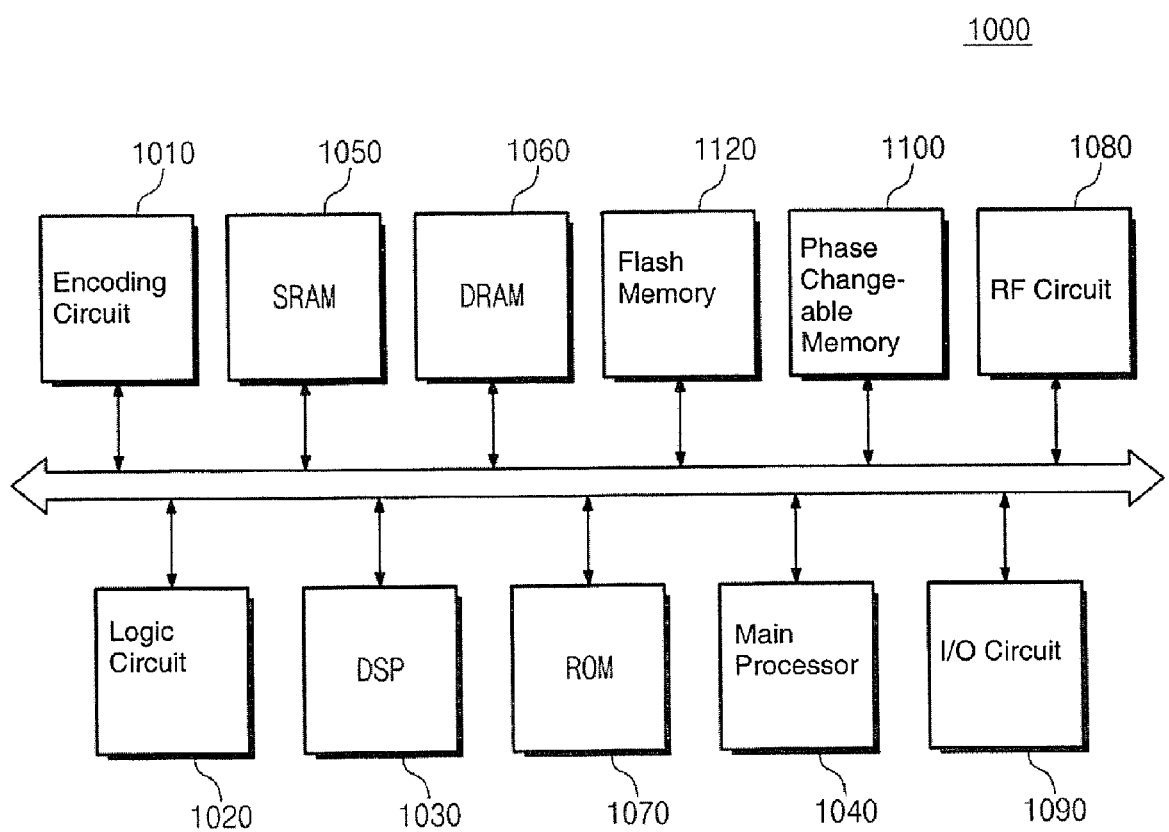
FIG. 20 is a block diagram of a wireless communication device that includes a phase changeable memory that is configured in accordance with some embodiments of the present invention.

FIG. 20 is a block diagram of a wireless communication device 1000 that includes a phase changeable memory configured in accordance with some embodiments of the present invention. Referring to FIG. 20, the wireless communication device 1000 may be configured as a cellular voice/data communication terminal. The wireless communication device 1000 Includes an encoding/decoding circuit 1010, a logic circuit 1020, a digital signal processor (DSP) 1030, a main processor 1040, a SRAM 1050, a DRAM 1060, a ROM 1070, a RF circuit 1080, an I/O circuit 1090, a phase changeable memory 1100, and a flash memory 1120. With the exception of the phase changeable memory 1100, the other illustrated components of the wireless communication device 1000 can be configured in a conventional manner to provide cellular voice/data communication functionality with remote cellular radio transceiver base stations and cellular communication networks, and/or to provide wireless local/wide area network communication functionality with remote wireless network routers. The phase changeable memory 1100 is configured in accordance with at least one embodiment of the present invention. For example, the phase changeable memory 1100 may be configured as shown in one or more of FIGS. 1-18.

The encoding/decoding circuit 1010 and the DSP 1030 may be configured, for example, to communicate using one or more cellular communication protocols such as Advanced Mobile Phone Service (AMPS), ANSI-136, Global Standard for Mobile (GSM) communication, General Packet Radio Service (GPRS), enhanced data rates for GSM evolution (EDGE), code division multiple access (CDMA), wideband-CDMA, CDMA2000, and Universal Mobile Telecommunications System (UMTS), and/or using a Bluetooth protocol and/or one or more wireless location area network protocols such as 802.11a, 802.11b, 802.11e, 802.11g, and/or 802.11i.

The foregoing is illustrative of the present invention and is not to be construed as limiting thereof. Although a few embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims. The invention is defined by the following claims, with equivalents of the claims to be included therein.

What is claimed is:

1. A method of fabricating an integrated circuit memory cell, comprising:

forming a first electrode;

forming an amorphous variable resistivity material on the first electrode;

after forming the amorphous variable resistivity material, forming a crystalline variable resistivity material on the amorphous variable resistivity material; and forming a second electrode on the crystalline variable resistivity material, wherein:

forming an amorphous variable resistivity material on the first electrode comprises:

in a first process of a first deposition step, feeding hydrogen (H2) and an inert carrier gas carrying a germanium (Ge) precursor and a tellurium (Te) precursor onto the first electrode for a first time, wherein a ratio of H2 to inert carrier gas is a first value, and in a second process of the first deposition step, feeding hydrogen (H2) and an inert carrier gas carrying an antimony (Sb) precursor and a Te precursor onto the first electrode for a second time, wherein a ratio of H2 to inert carrier gas is a second value; and forming a crystalline variable resistivity material on the amorphous variable resistivity material comprises:

in a first process of a second deposition step, feeding hydrogen (H2) and an inert carrier gas carrying a Ge precursor and a Te precursor onto the amorphous variable resistivity material for a third time that is greater than the first time, wherein a ratio of H2 to inert carrier gas is a third value that is less than the first value, and in a second process of the second deposition step, feeding hydrogen (H2) and an inert carrier gas carrying a Sb precursor and a Te precursor onto the amorphous variable resistivity material for a fourth time that is greater than the second time, wherein a ratio of H2 to inert carrier gas is a fourth value that is less than the second value.

2. The method of claim 1, wherein:

in the first process of the second deposition step to form the crystalline variable resistivity material, the third time, during which the inert carrier gas carries the Ge precursor and the Te precursor onto the amorphous variable resistivity material, is about 1.5 times to about 5 times greater than the first time; and in the second process of the second deposition step to form the crystalline variable resistivity material, the fourth time, during which the inert carrier gas carries the Sb precursor and the Te precursor onto the amorphous variable resistivity material, is about 1.5 times to about 5 times greater than the second time.

3. The method of claim 1, wherein:

in the first process of the second deposition step to form the crystalline variable resistivity material, the third value of the ratio of H2 to inert carrier gas is about 10 times to about 100 times less than the first value; and in the second process of the second deposition step to form the crystalline variable resistivity material, the fourth value of the ratio of H2 to inert carrier gas is about 10 times to about 100 times less than the second value.

4. The method of claim 1, wherein the carrier gas simultaneously carries the Sb and Te precursors during the second process of the first and second deposition steps.

5. The method of claim 1, further comprising:

forming the amorphous and crystalline variable resistivity materials within a chamber; and purging the chamber of the precursors using at least the inert carrier gas between the first and second processes of the first deposition step and between the first and second processes of the second deposition step.

6. The method of claim 1, wherein an atomic % ratio of Ge in the amorphous variable resistivity material to Ge in the crystalline variable resistivity material is greater than 1.

7. The method of claim 1, wherein an atomic % ratio of Sb in the amorphous variable resistivity material to Sb in the crystalline variable resistivity material is less than 1.

8. The method of claim 1, wherein an atomic % ratio of Ge in the amorphous variable resistivity material to Sb in the amorphous variable resistivity material is greater than 1.

9. A method of fabricating an integrated circuit memory cell, comprising:
forming a first electrode;
forming a first variable resistivity material on the first electrode by:
in a first process of a first deposition step, feeding hydrogen (H2) and an inert carrier gas simultaneously carrying a germanium (Ge) precursor and a tellurium (Te) precursor onto the first electrode for a first time, wherein a ratio of H2 to inert carrier gas is a first value, and
in a second process of the first deposition step, feeding hydrogen and an inert carrier gas simultaneously carrying an antimony (Sb) precursor and a Te precursor onto the first electrode for a second time, wherein a ratio of H2 to inert carrier gas is a second value;
forming a second variable resistivity material on the first variable resistivity material by:
in a first process of a second deposition step, feeding hydrogen and an inert carrier gas simultaneously carrying a Ge precursor and a Te precursor onto the first variable resistivity material for a third time that is greater than the first time, and
in a second process of the second deposition step, feeding hydrogen and an inert carrier gas simultaneously carrying a Sb precursor and a Te precursor onto the first variable resistivity material for a fourth time that is greater than the second time; and
forming a second electrode on the second variable resistivity material.

10. The method of claim 9, wherein:
a ratio of H2 to inert carrier gas in the first process of the second deposition step is a third value that is less than the first value; and
a ratio of H2 to inert carrier gas in the second process of the second deposition step is a fourth value that is less than the second value.

11. The method of claim 9, wherein:
the first variable resistivity material formed by the first and second processes of the first deposition step is an amorphous variable resistivity material; and
the second variable resistivity material formed by the first and second processes of the second deposition step is a crystalline variable resistivity material.

12. The method of claim 9, wherein the first variable resistivity material and the second variable resistivity material each comprise at least one chalcogenide material.

13. The method of claim 9, further comprising:
alternately repeating the first and second processes of the first deposition step a first number of times; and
alternately repeating the first and second processes of the second deposition step a second number of times that is greater than the first number of times.

14. The method of claim 13, wherein the first number of times is less than 50 and the second number of times is more than 60.

15. The method of claim 9, wherein:
in the first process of the second deposition step to form the second variable resistivity material, the third time, during which H2 and the inert carrier gas carrying the Ge precursor and the Te precursor are flowed onto the first variable resistivity material, is about 1.5 times to about 5 times greater than the first time; and
in the second process of the second deposition step to form the second variable resistivity material, the fourth time, during which H2 and the inert carrier gas carrying the Sb precursor and the Te precursor are flowed onto the first variable resistivity material, is about 1.5 times to about 5 times greater than the second time.

16. The method of claim 9, wherein
in the first process of the second deposition step to form the second variable resistivity material, the third value of the ratio of H2 to inert carrier gas is about 10 times to about 100 times less than the first value; and
in the second process of the second deposition step to form the second variable resistivity material, the fourth value of the ratio of H2 to inert carrier gas is about 10 times to about 100 times less than the second value.

17. The method of claim 9, wherein:
in the first process of the first deposition step to form the first variable resistivity material, the H2 and the inert carrier gas carrying the Ge precursor and the Te precursor are flowed onto the first electrode for less than 0.2 seconds, wherein a ratio of H2 to inert carrier gas is greater than 2; and
in the second process of the first deposition step to form the first variable resistivity material, the H2 and the inert carrier gas carrying the Sb precursor and the Te precursor are flowed onto the first electrode for less than 0.2 seconds, wherein a ratio of H2 to inert carrier gas is greater than 2.

18. The method of claim 17, wherein:
in the first process of the second deposition step to form the second variable resistivity material, the H2 and the inert carrier gas carrying the Ge precursor and the Te precursor are flowed onto the first variable resistivity material for at least 0.6 seconds, wherein a ratio of H2 to inert carrier gas is less than 2; and
in the second process of the second deposition step to form the second variable resistivity material, the H2 and the inert carrier gas carrying the Sb precursor and the Te precursor are flowed onto the first variable resistivity material for at least 0.6 seconds, wherein a ratio of H2 to inert carrier gas is less than 2.

19. The method of claim 9, wherein the inert carrier gas simultaneously carries the Sb and Te precursors during the second processes of the first and second deposition steps.

20. The method of claim 9, further comprising:
forming the first and second variable resistivity materials within a chamber; and
purging the chamber of the precursors using at least the inert carrier gas between the first and second processes of the first deposition step and between the first and second processes of the second deposition step.

21. The method of claim 9, wherein an atomic % ratio of Ge in the first variable resistivity material to Ge in the second variable resistivity material is greater than 1.

22. The method of claim 9, wherein an atomic % ratio of Sb in the first variable resistivity material to Sb in the second variable resistivity material is less than 1.

23. The method of claim 9, wherein an atomic % ratio of Ge in the first variable resistivity material to Sb in the first variable resistivity material is greater than 1.

24. The method of claim 9, further comprising:
forming a nucleation promoting layer on the first electrode, wherein the first variable resistivity material is formed on the nucleation promoting layer.

25. The method of claim 24, wherein the nucleation promoting layer is formed from a metal oxide.

* * * * *